(12) United States Patent
Dhanwada et al.

(10) Patent No.: US 7,296,251 B2
(45) Date of Patent: Nov. 13, 2007

(54) METHOD OF PHYSICAL PLANNING VOLTAGE ISLANDS FOR ASICS AND SYSTEM-ON-CHIP DESIGNS

(75) Inventors: Nagashyamala R. Dhanwada, Wappingers Falls, NY (US); Youngsoo Shin, Millwood, NY (US); Jingcao Hu, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 10/853,370

(22) Filed: May 25, 2004

(65) Prior Publication Data

US 2005/0278676 A1    Dec. 15, 2005

(51) Int. Cl.
G06F 17/50       (2006.01)
(52) U.S. Cl. .................................. 716/9; 716/6; 716/7
(58) Field of Classification Search ...................... None
See application file for complete search history.

(56) References Cited

U.S. PATENT DOCUMENTS

| | | | | |
|---|---|---|---|---|
| 4,890,238 | A * | 12/1989 | Klein et al. ..................... | 716/7 |
| 6,631,502 | B2 * | 10/2003 | Buffet et al. ................... | 716/4 |
| 6,779,163 | B2 * | 8/2004 | Bednar et al. ................. | 716/7 |
| 6,792,582 | B1 * | 9/2004 | Cohn et al. .................... | 716/7 |
| 7,000,214 | B2 * | 2/2006 | Iadanza et al. ............... | 716/18 |

OTHER PUBLICATIONS

R.A. Bergamaschi et al., "SEAS: A System for Early Analysis of SoCs," CODES+ISSS, Oct. 2003, pp. 150-155.*

A.B. Kahng, "Classical Floorplanning Harmful?", ISPD 2000, pp. 207-213.*
D. Kang et al., "Multiple-Vdd Scheduling/Allocation for Partitioned Floorplan," ICCD 2003, 7 pages.*
D.E. Lackey et al., "Managing Power and Performance for System-on-Chip Designs using Voltage Islands," 2002 IEEE, pp. 195-202.*
F.N. Najm, "A Survey of Power Estimation Techniques in VLSI Circuits," IEEE Trans. on VLSI Systems, vol. 2, No. 4, Dec. 1994, pp. 446-455.*

(Continued)

*Primary Examiner*—Leigh M. Garbowski
(74) *Attorney, Agent, or Firm*—H. Daniel Schurmann

(57) ABSTRACT

Voltage islands enable a core-level power optimization of ASIC/SoC designs by utilizing a unique supply voltage for each cluster of the design. Creating voltage islands in a chip design for optimizing the overall power consumption consists of generating voltage island partitions, assigning voltage levels and floorplanning. The generation of voltage island partitions and the voltage level assignment are performed simultaneously in a floorplanning context due to the physical constraints involved. This leads to a floorplanning formulation that differs from the conventional floorplanning for ASIC designs. Such a formulation of a physically aware voltage island partitioning and method for performing simultaneous voltage island partitioning, level assignment and floorplanning are described, as are the definition and the solution of floorplanning for voltage island based designs executed under area, power, timing and physical constraints. The physical planning of voltage islands includes: a) characterizing cell clusters in terms of voltages and power consumption values; b) providing a set of cell clusters that belong to a single voltage island Random Logic Macro (RLM); and c) assigning voltages for the voltage island RLMs, all within the context of generating a physically realizable floorplan for the design.

7 Claims, 6 Drawing Sheets

OTHER PUBLICATIONS

R. Puri et al., "Pushing ASIC Performance in a Power Envelope," DAC 2003, pp. 788-793.*

X. Tang et al., "FAST-SP: A Fast Algorithm for Block Placement based on Sequence Pair," 2001 IEEE, pp. 521-526.*

H. Murata et al., "VLSI Module Placement Based on Rectangle-Packing by the Sequence-Pair," IEEE Trans. on CAD of ICs and Systems, vol. 15, No. 12, Dec. 1996, pp. 1518-1524.*

X. Tang et al., Floorplanning with Alignment and Performance Constraints, DAC 2002, pp. 848-853.*

K. Usami et al., "Automated Low-Power Technique Exploiting Multiple Supply Voltages Applied to a Media Processor," IEEE Journal of Solid-State Circuits, vol. 33, No. 3, Mar. 1998, pp. 463-472.*

* cited by examiner

Algorithm VoltageIslandPlanning
Begin
L1: Initial island partitioning and floorplan;
L2: Perturb current solution;
L3: Update VICG;
L4: Floorplan for VICG edge weight minimization;
L5: Merge voltage islands;
L6: for each new merged island do
L7:     Floorplan for area minimization;
L8: end do
L8: Cost calculation;
L9: if meet exit criteria then
L10:     Output solution;
L11: Return;
L11: else Go to L2;
L13: end if
End

FIG. 3

Algorithm MergeIslands
Begin
L1:  Sort supply voltage levels by the number of related islands;
L2:  for each supply voltage level $l_i$ do
L3:              Find all islands with voltage $l_i$;
L4:              Create rectangular region R;
L5:              Add R to split list L;
L6:              while L 6 = fg do
L7:                          Get next region R from L;
L8:                          if R contains no more than one island then
L9:                          Continue;
L10:                         If R overlap with an alien island pa then
L11:                                     Cut R using pa into smaller regions;
L12:                                     Combine new generated regions;
L13:                                     Add new regions to L;
L14:                         else
L15:                                     Merge islands in R to pn;
L16:                                     Floorplan pn for area minimization;
L17:                         end if
L18:             end do
L19: end do
End

FIG. 4

```
Algorithm IslandLevelFloorplan
Begin
L1:   outline = original bounding box;
L2:   while feasible floorplan exist do
L3:       floorplan = find floorplan with outline;
L4:       b = decide boundary to shrink;
L5:       shrink outline from boundary b;
L6:   end do
L7:   return floorplan;
End
```

FIG. 6

METHOD OF PHYSICAL PLANNING VOLTAGE ISLANDS FOR ASICS AND SYSTEM-ON-CHIP DESIGNS

BACKGROUND OF THE INVENTION

The present invention is related to the automated design of integrated circuit (IC) chips and, more particularly, to a method of physical planning voltage islands applicable to ASICs and System-on-a-Chip designs.

While meeting the timing requirements of modern System-on-a-Chip (SoC) designs is difficult, power consumption has become a critical design metric due to increasing power density and the wide use of portable systems. Many techniques are available for reducing power consumption, of which one of the most effective ones consists in lowering the voltage ($V_{DD}$) because power consumption due to switching is proportional to $V_{DD}^2$ and the standby power consumption is proportional to $V_{DD}$. However, lowering $V_{DD}$ leads to a reduced circuit performance, the amount of reduction being bound by the delay on the critical path which leaves most non-critical paths having a large slack.

A dual $V_{DD}$ approach has been described by K. Usami, et al., in the article "Automated Low-Power Technique Exploiting Multiple Supply Voltages Applied to a Media Processor," IEEE Journal of Solid-State Circuits, Vol. 33, No. 3, March 1998, pp. 463-472, which provides an initial solution to the above described problem by assigning a high $V_{DD}$ value to circuits on the critical path and a low $V_{DD}$ to circuits on the non-critical path. Extending the dual $V_{DD}$ concept necessitates the use of multiple $V_{DD}$s to better address the power problem. The main problem when using multiple supplies is the distribution of power to the various voltage supplies. In a grid-style power distribution network, a fine-grained approach, such as a gate-based one is extremely difficult to achieve. In a coarse-grained approach, an RLM (Random Logic Macro) consisting of a group of cells, is made to operate at its own voltage, and the entire design is implemented by a plurality of RLMs operating at different voltages. This approach, while alleviating the problem of power distribution in the fine grained approach presents several problems such as: identifying partitions of circuits for a $V_{DD}$ assignment; characterizing each partition with respect to $V_{DD}$; and floorplanning partitions such that those powered by the same $V_{DD}$ are grouped together. These grouping of partitions essentially lead to the formation of a voltage island, i.e., an independent region of a chip powered by its own power supply voltage.

The partitioning function applicable to a voltage island planning was introduced by D. E. Lackey, et al., "Managing Power and Performance for System-on-Chip Designs using Voltage Islands", Proc. ICCAD 2002. However, its application is limited because partitions and floorplanning are assumed to be given. It merely explores different combinations of $V_{DD}$ to ensure that the timing is satisfied and power is minimized. If partitioning and floorplanning are not performed intelligently, the design space becomes significantly narrow. The number of partitions it can handle is limited as well, since the complexity of the approach grows exponentially.

Fine-grained voltage island techniques have been further described by R. Puri, et al., "Pushing ASIC Performance in a Power Envelope," Proc. DAC, pp. 788-793, June 2003. These, however, are still limited to using two $V_{DD}$s instead of many $V_{DD}$s.

Introducing voltage islands complicates the chip design process even more with respect to static timing, power routing, floorplanning, and the like. The complexity grows significantly with the number of islands. Thus, a designer using voltage islands is required to group together cores (i.e., netlists consisting of pre-designed and pre-verified macros) powered by the same voltage source while ensuring that the group thus created does not violate other design metrics, such as timing and wiring congestion. Moreover, voltage islands need to be placed in close proximity to power pins in order to minimize the power routing complexity and the IR drop. Since each island requires its own power grid and level converters to communicate with different islands, the overhead related to area and delay becomes unavoidable. Additional area overhead may become available when using dead spaces when two or more cores are placed in the same island, although they cannot always be packed effectively. These additional requirements make the problem of generating the floorplan of a design consisting of voltage islands a unique one, a problem which is formulated and solved by the present invention. These problems have not been addressed in prior works in related areas.

Accordingly, there is a distinct need in the industry for a different approach to the above described problem. The voltage island planning is initiated very early in the design phase. This includes all the aforementioned problems, i.e., partitioning, characterizing, and floorplanning in the earlier stages of the design and which need to be solved in order to obtain a coarse grained voltage island solution for the automated design of integrated circuit chips.

OBJECTS AND SUMMARY OF THE INVENTION

Thus, it is an object of the present invention to provide a method of formulating physically aware voltage island partitioning and for solving the problem of simultaneous voltage island partition generation, voltage level assignment and floorplanning.

It is another object of the present invention to define and obtain an effective floorplanning of voltage island based designs under area, power, timing and physical constraints (presence of pre-existing locations for certain cores, power pin proximity constraints).

It is a further object of the present invention to provide a method of generating the physical planning of coarse grained voltage islands in the design of an IC chip.

These and other objects, aspects, and advantages of the invention are provided by a physical planning method that involves: characterizing cell clusters in terms of voltages, obtaining cell clusters that includes a single voltage island RLM, and assigning voltages to the voltage island RLMs, while remaining within the context of generating a physically realizable floorplan for the design.

In a first aspect of the invention, there is provided a method of generating a partitioning of an input design netlist, such that each partition corresponds to a voltage island running at a specific voltage, and such that the overall power consumption of the design is minimized.

The invention further provides a method to achieve voltage island partitions for the design netlist while taking into account the physical design impacts and generating a floorplan for such a voltage island based design. The overall methodology for using the voltage island physical planner consists of generating an initial partition (in case of flat design netlists), and characterizing the initial partitions in terms of voltage and power. Once the initial design has been partitioned, each partition is provided with its own voltage and power tables that are generated, and which are used by the voltage island physical planning method to generate the required voltage island partitioning and floorplan. This process takes into account all the physical design constraints involved to arrive at the final solution.

The voltage island physical planning step consists of: a) creating an internal model, referred to as the voltage island compatibility graph that captures the relationships (block compatibilities in terms of voltage levels) between the initial blocks that make up the input design netlist, b) chip level floorplanning of the islands that were generated that attempts to place compatible voltage island partitions in close proximity of each other, and c) performing a voltage island level floorplanning that places blocks within a voltage island while minimizing the unused space within the island. The resulting voltage island partitions are taken through the rest of the physical design and timing closure steps to complete the design process.

BRIEF DESCRIPTION OF THE DRAWINGS

The accompanying drawings, which are incorporated in and which constitute part of the specification, illustrate presently preferred embodiments of the invention which, together with the general description given above and the detailed description of the preferred embodiments given below serve to explain the principles of the invention.

FIG. 3 is an outline of the algorithm used for planning voltage islands, in accordance with the present invention.

FIG. 4 depicts the outline of the island merging process.

FIG. 6 shows an outline of the island-level floorplanning.

DETAILED DESCRIPTION OF THE INVENTION

Figure 1:
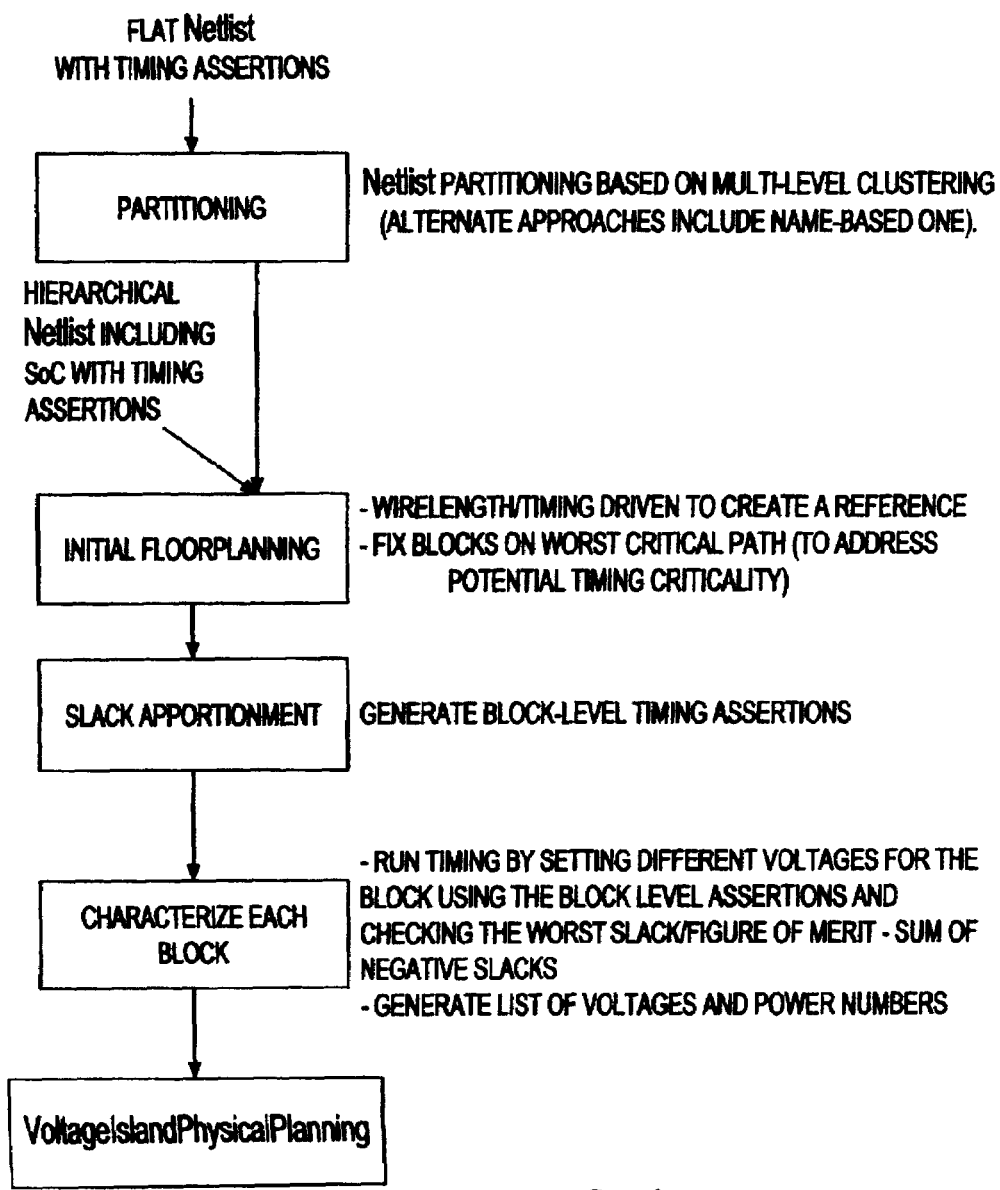
FIG. 1 shows the overall design flow for using voltage island physical planning according to the present invention.

FIG. 1 shows the outline of the overall design flow when using the voltage island physical planning methodology of the present invention. If the netlist is flat, partitioning is performed such that each partition consists of only latch-to-latch paths. The result of this partitioning process consists of clusters of cells. This is achieved by first identifying the latches that are closest to the primary outputs (POs) followed by creating fan-in cones for each latch. This process is repeated for latches closest to the fan-in cones thus generated, and continued until the primary inputs (PIs) are reached. Since many such fan-in cones and overlaps between them exist, it becomes necessary to merge some of the cones based on the number of partitions required and the amount of logic that is cloned in the region of overlap.

If the input netlist is a SoC like design that is assembled from cores, then the inventive method uses the existing cores as the starting clusters upon which voltage island physical planning is executed. The reason for dividing (or using existing divisions in the form of cores) the design into clusters bounded by latches is to characterize each of the clusters almost independently from the others. Since the cycle time of the design (multiple of cycle times if there are multi-cycle paths) is known, and all the paths in the partition are between latches, $V_{DD}$ is modified until the cycle time is satisfied. This provides a list of values for $V_{DD}$ (and corresponding power consumption) for each partition. The timing between partitions (delay through inter-partition interconnections) can be controlled either during floorplanning stage or by the chip designer.

In the next step, the floorplanning of clusters is executed with the object of creating voltage island partitions. The result of this initial floorplanning step is to create a reference point for the start of the voltage island physical planning step. It potentially addresses timing criticality issues by fixing certain clusters that fall on the critical timing paths.

The following step of slack apportionment consists of generating cluster level timing constraints from the chip level timing constraints (which is one input to the overall voltage island physical planning method).

The characterization process is initiated once the chip level timing constraints have been generated for each of the clusters (or cores). This step consists of executing a static timing analysis for each of the clusters at different voltages using the cluster level timing constraints and checking for a worst timing slack at each voltage. If the worst slack is acceptable within the user defined threshold, then the particular voltage at which the timing analysis was executed is added to the list of compatible voltages for the cluster being characterized. Similarly, a power consumption number is associated with the cluster at this particular voltage using a spreadsheet based technique. The result of the characterization step is a list of permissible voltage numbers and power numbers for each of the clusters (or cores) in the input design. These are referred to as voltage and power tables for the clusters, and are used by the voltage island physical planning step in generating a voltage island partition and floorplan for the input chip design netlist.

The final step is the actual voltage island physical physical planning method, the result of which is the assignment of clusters (or cores) to voltage island partitions or random logic macros (RLMs), and the assignment of a voltage (amounting to the creation of a voltage island) at a given location of the chip to the RLM.

Figure 2:
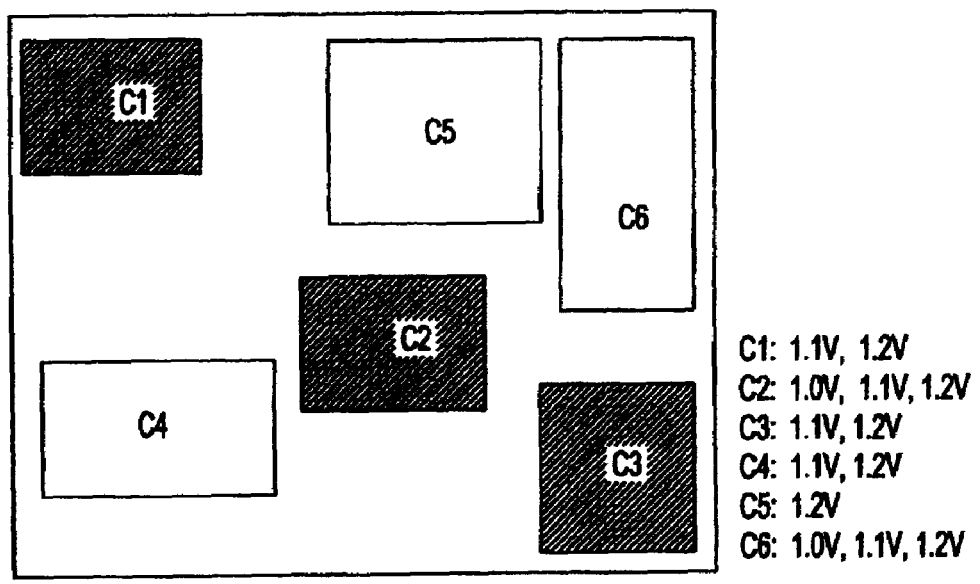
FIG. 2 illustrates an example for creating voltage islands applicable to a System-on-Chip.
Figure 5A:
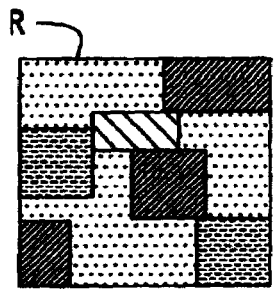
FIGS. 5A-5E illustrate the detailed process of merging islands
Figure 5B:
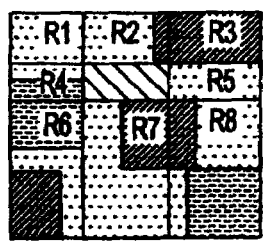
Figure 5C:
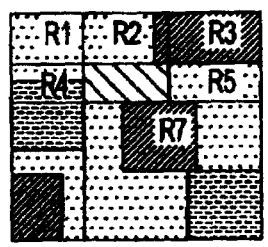
Figure 5D:
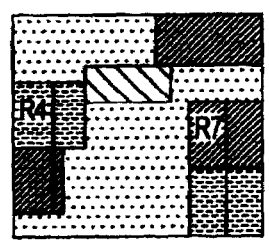
Figure 5E:
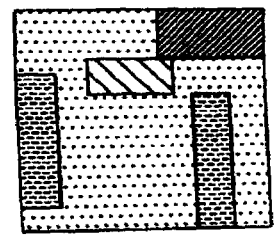

Referring now to FIG. 2 illustrating an example of creating voltage islands, each cluster (or core) is associated with a list of acceptable voltages. Clusters c1, c2 and c3 are pre-placed, e.g., all the cores having a fixed shape. The chip voltage level is assumed to be 1.2V, which implies that a voltage island for cores operating at 1.2V is not required. In order to minimize power consumption, an obvious way is to operate each core at its lowest permissible voltage. This implies that at least three voltage islands are needed: one for c2 and c6, one for c1 and c4 (or c1), and one for c3 (or c3 and c4). Note that one cannot create a single voltage island with c1, c3 and c4 because the bounding rectangle would cover the entire chip image. Still, this is not a perfect solution: an island formed by c2 and c6 may not be allowed because the enclosing rectangle violates the constraint of proximity to the power pins, and an island with c1 and c4 (or c3 and c4) has dead space within. More islands may be used to alleviate at least some of these problems, but this is usually not deemed to be advantageous because the number of islands that can be created is constrained.

The example clearly shows a constrained floorplanning problem with an objective very different from the traditional floorplanning. The present invention addresses, among others, the floorplanning problem for creating voltage island with the objective of minimizing the combined metrics including power consumption and area overhead. The resulting voltage island partition and floorplan become the starting point for the rest of the design process, and which becomes an early feedback to the chip designer on the physical implementability of voltage island solutions.

Formulation of the Problem

Assuming an SoC design consisting of a set of cores C. The chip image for which cores are to be floorplanned is given, implying that a fixed frame floorplanning is executed in contrast with a conventional minimum-area floorplanning, where the aim of the floorplanner is to minimize the total area occupied by the floorplan, as opposed to working with a given area. The choice depends on the overall chip design process, i.e., the floorplanning process is assumed to occur after the die size and package have been chosen. For each core $C_i \in C$, the area is given as the product $w_i h_i$, where $w_i$ and $h_i$ respectively represent the width and the height. The shape is fixed for hard cores, yet rotation and mirroring are allowed. For soft cores, the acceptable aspect ratios are given as constraints, i.e., the inequality $a_i \leq w_i/h_i \leq b_i$ must be satisfied. Each core is also associated with a power table, which specifies legal voltage levels and corresponding average power consumption values. Let $\pi_i$ denote a voltage island which is a set of cores, i.e., $\pi_i \subset C$. Thus, $C = \Sigma \pi_i \cup \Sigma c_i$, where $\Sigma c_i$ denotes cores not assigned to any islands and is operated by chip-level power supply. A voltage island has a unique voltage, denoted as $v(\pi_i)$, which is selected from a list of legal supply voltage levels, denoted as $V(\pi_i)$ which $\pi_i$ can work at, thus $v(\pi_i) \in V(\pi_i)$. $V(\pi_i)$ is equal to the intersection of the legal voltage levels of all $\pi_i$'s composit cores. A voltage island is called a composite island if, and only if, it contains at least two cores. Otherwise, it is referred to as an atomic island. A voltage island $\pi_i$ is said to be compatible with another voltage island $\pi_j$ if, and only if, $v(\pi_i) = v(\pi_j)$, i.e., they have the same voltage level.

A preliminary floorplan is initially provided by the chip designer or it may be generated as a result of a floorplanning step having different objectives, such as performance. In the initial floorplan, some cores may be pre-fixed or assigned to a certain area to which the core can be moved to. This can be generalized by associating to each core a move bound $(l_i, r_i, b_i, u_i)$, where $(l_i, b_i)$ and $(r_i, u_i)$ denote the bottom-left and upper-right corners, respectively. Move bound overlaps with a core having a fixed location, which represents the entire chip image in case the core is not assigned any move bounds.

The problem of voltage island planning of the present invention consists of partitioning and floorplanning. The problem to be solved consists of:

Partitioning C into a set of voltage islands and cores,

Area-planning each voltage island, and

Floorplanning islands and cores.

Note that the area-planning of each island involves another floorplanning (voltage island-level floorplanning). The objective is to simultaneously minimize the power consumption, the area overhead, and the number of voltage islands. At the same time, the number of voltage islands should be less than or equal to a designer-specified constraint.

Voltage Island Planning Algorithm

A graph model is built to capture the current voltage island partitioning solution in an abstract way. A Voltage Island Compatibility Graph (VICG) $G(\Pi, A)$ is a complete undirected graph. Each vertex $\pi_i \in \Pi$ represents a voltage island and each arc $a_{i,j} \in A$ characterizes the "attraction" between islands $\pi_i$ and $\pi_j$. Each arc has a weight $w(a_{i,j})$ which is calculated using the following equation:

$$w(a_{i,j}) = \begin{cases} 1 + \alpha \times wires_{i,j}, & \text{if } v(\pi_i) = v(\pi_j) \\ 0, & \text{otherwise} \end{cases} \quad (1)$$

where $\alpha$ is a constant, and $wires_{i,j}$ denotes the number of wires going between $\pi_i$ and $\pi_j$. Weight is used to guide the floorplanning by describing potential savings when two islands are placed adjacent to each other, which in turn gives the possibility of island merging. Intuitively, if the islands are not compatible, then they are independent since they cannot be merged even when they are adjacent to each other. On the other hand, placing two compatible islands near to each other increases the possibility of merging them into one island, which leads to a lower cost. Additionally, an island having more interconnections with its compatible islands is preferably given a higher priority in being placed nearby since more interconnections between separate voltage islands implies more level shifters, which leads to a higher area cost. The use of the VICG structure also offers flexibility in setting up the optimization objectives. For instance, one may easily add the interconnect performance into the optimization by giving higher weights to those edges which lie in critical paths.

The method of the present invention is based on simulated annealing which guides the floorplanning and the island merging processes through the VICG graph.

Referring now to FIG. 3, there is shown an outline of the main steps of the method of the present invention. Given an initial voltage island partitioning and its associated floorplanning, the approach iteratively improves the solution quality by local perturbation, re-floorplanning and islands merging. Specifically, given the current solution, the first step consists of producing a perturbation. This perturbation is then reflected back to its associated VICG. Next, a chip-level floorplanning is applied with the goal of finding a floorplan where compatible islands are likely to be placed in adjacent positions. The island merging process is then executed by identifying regions containing potentially mergeable islands and, then, merging these islands. In order to shrink the area of the islands, an island-level floorplanning is performed on each of the newly merged islands with the goal of minimizing its bounding box. Finally, the new solution is evaluated and its cost is calculated. The above process is repeated until a satisfactory solution is found or, if none is forthcoming, a certain exit criteria is met. A unified cost function is preferably used, preferably the weighted sum of different metrics including the number of islands, average power consumption, and area overhead. Note that given the flexibility of the simulated annealing algorithm, other cost functions (e.g. routing congestion) can be included, if necessary.

Integrated Floorplanning Process

In each iteration of the voltage island planning algorithm, there are two levels of floorplanning that need to be applied:

a) The chip-level floorplanning (L4 in FIG. 3) attempts to arrange the compatible islands in adjacent positions by minimizing the following cost function:

$$\text{cost} = \sum_{\forall i,j} w(a_{i,j}) \times d(\pi_i, \pi_j) \quad (2)$$

where $d(\pi_i,\pi_j)$ is the distance between the islands, and $w(a_{i,j})$ is defined as in equation (1).

b) The island-level floorplanning (L7 in FIG. 3) is applied to each newly merged island, as the composing cores inside the merged island may not be placed compactly.

The floorplanning with the goal of area minimization helps not only reduce the dead space within the islands, but also it legalizes the newly generated floorplan by reducing the risk of islands overlapping. Because of the tight coupling between the floorplanning and the overall optimization, an efficient implementation of the floorplanner is critical to the speed and performance of the inventive method. In the present invention, a floorplanner based on a sequence pair representation and evaluation is employed. The floorplanner uses simulated annealing on the sequence pair data structure, and is capable of evaluating in O(n log log n) time, where n represents the total number of blocks. Move bound support is achieved by adding dummy blocks. To exploit the property that a merged island contains just a few cores (usually under 5), the island-level floorplanner automatically switches between simulated the annealing mode and the enumerating mode based on the number of composing cores in the target island, which helps reducing the run time.

Perturbation

Perturbations to the current solution are performed at the beginning of each iteration. More precisely, one of the following three moves is probabilistically chosen:

a) Island split move (ISM):
   A composite island $\pi_i$ is randomly selected and split into a set of islands, each of which consists of one $\pi_i$ composing core.

b) Island voltage change move (IVCM):
   In this move, a voltage island supporting two or more legal supply voltages is randomly selected, and its supply voltage level randomly switched to one of its legal voltages.

c) Multi-island voltage change move (MIVCM):
   In this move, a voltage supply level $l_i$ is randomly chosen and all the islands supporting $l_i$ are assigned voltage level $l_i$.

All the above three perturbations lead to a change in the VICG graph that corresponds to the current solution. More specifically, IVCM and MIVCM moves change the relevant arc weights, while ISM move changes not only the VICG's arc weights but also its topology.

Islands Merging

Following the perturbation and chip-level floorplanning, islands that are compatible with each other are likely to be placed in adjacent positions. The heuristic in FIG. 4 is then applied to detect and merge the islands that can be merged.

As illustrated in FIG. 4, the supply voltage levels used are first sorted based on how many voltage islands are assigned to the corresponding voltage level. More precisely, the voltage levels that are used by more voltage islands are given priority. Intuitively, the more islands use the same voltage level, the higher the probability of finding mergable islands using that voltage will be.

Next, the following operation is performed on each voltage level in the list. For each voltage level $l_i$, all the voltage islands that use $l_i$ are selected, and a rectangular region R is created by drawing the bounding box surrounding these islands (step L4 in FIG. 4). Obviously, to reduce the number of voltages islands, it is advantageous to merge all the islands at voltage level $l_i$ into one merged island having a shape R. Unfortunately, R may overlap with other islands, thus making the floorplan infeasible. Additionally, creating a merged island having a shape R significantly increases the area overhead, as there can be significant dead space therein. The loop L7 to L18 in FIG. 4 resolves the aforementioned problems by recursively subdividing region R into smaller regions together with island-level floorplanning.

To better describe the merging algorithm, FIG. 5 illustrates an example that provides a step-by-step explanation of the island merging process. FIG. 5A shows an instance of a section of the initial floorplan of a chip image. As shown in step L4 of FIG. 4, the initial rectangular region R is the external bounding box of FIG. 5A. Because it overlaps with an alien island $\pi_a$ which uses a different voltage level $I_2$, creating a merged island with the size of this bounding box is not feasible. Additionally, such a solution will also contain a significant amount of dead space. Code L6 to L18 in FIG. 4 is used to resolve this issue. More specifically, the original region is divided into eight regions by cutting it with $\pi_a$ (as shown in FIG. 5B). In the next steps, these newly generated regions are combined to form bigger regions. Higher priority is given to region combinations that contain more islands, such that more islands are likely to be merged in the following steps. For instance, region R7 will be combined with region R8 instead of region R6, since combining regions R7 and R8 generates a new region that contains two islands. On the other hand, if regions R6 and R7 were combined instead, the newly formed region will end containing no islands. FIG. 5C shows the new regions (R1 and R7) left after the combining step. The above procedure is repeated until the regions under consideration do not overlap with any alien island. For each of these remaining regions, a new island is built by merging the islands within the corresponding regions. Meanwhile, the island-level floorplanner is applied to each of the newly merged islands in order to minimize their outlines. By way of example, FIG. 5D illustrates this step, while FIG. 5E shows the partitioning and the floorplan at the end of the iteration. Since islands $\pi_6$ and $\pi_7$ contain cores having a fixed location, both are referenced as fixed islands. It is worth mentioning that the existence of fixed cores or cores with move bound adds extra complexity to the island-level floorplanning. A minimal outline floorplan needs to be found under the constraints of satisfying fixed core and/or specified move bounds. On the other hand, most of the previous work in floorplanning either assumes no move bound constraints when dealing with area minimization, or targets finding a floorplan under fixed outlines. Thus, previous results cannot be directly applied to solve the problem.

The heuristic in FIG. 6 is used for island-level the floorplanning, which converts the problem of area minimization into the one of finding feasible floorplan under a given outline. As shown, the process bounds the box obtained after the cutting (for instance, rectangle R1 in FIG. 5C as the initial outline of the floorplanning). If a feasible floorplan is found, the process attempts to decrease the size of the outline by incrementally shrinking it from the chosen boundary (north, east, south or west). The starting boundary for the shrinking process depends on the current slack in the floorplan while taking into consideration the relative position of the move bounds or the fixed cores with regard to the current outline boundary. The process is repeated until the outline cannot be shrunk further. This minimum corresponds to the bounding box with the minimal area. It is worth noting that although multiple floorplanning runs are needed to floorplan just one island, the execution time is deemed acceptable since an island usually contains a small number of cores.

Thus far, the present invention has been described by way of a cost function that includes area overhead, the number of voltage islands and power consumption of the system. However, the present method can be extended to incorporate other factors of interest to the design process. For instance, for designs wherein routing congestion is a serious issue, then the total wire length usually needs to be minimized during the floorplanning. The inventive method can be easily adapted to consider this scenario by modifying the arc weights equation of the VICG, to be as follows:

$$w(a_{i,j}) = \begin{cases} 1 + \alpha \times wires_{i,j} + \beta \times wires_{i,j}, & \text{if } v(\pi_i) = v(\pi_j) \\ \beta \times wires_{i,j}, & \text{otherwise} \end{cases} \quad (3)$$

where $\beta$ is a constan specified by the designer to control how much effort should be devoted to the wire length minimization.

Another important extension provides support for the bounded delay for the critical nets at the architecting stage. This is specially important as interconnect delay has become a serious issue in deep sub-micron designs. By adding dummy blocks to force the move bound of the related cores, the floorplanner guarantees that the critical nets do not exceed their specified length, which is directly related to the wire delay. However, caution must be used to guarantee the convergence of the optimization process where many constraints and optimization objectives need to be considered simultaneously.

Another way of addressing interconnect timing issues during the voltage island physical planning is through the direct interaction with the designer. In this case, the designer adaptively changes the input by adding additional constraints before applying the voltage island architecting tool. For instance, if it is found that in the current solution the timing constraints are violated for the links between cores $c_i$ and $c_j$, the designer can go back to the input specification, add a move bound $mb_{i,j}$ for both $c_i$ and $c_j$, and then reapply the tool to the modified input, such that the upper bound of the distance between $c_i$ and $c_j$ can be guaranteed. This automatically ensures that the timing constraints are satisfied. Additionally, if the signal between $c_i$ and $c_j$ is not registered at the core boundary, the designer can also restrict the allowed voltage levels which can be used by $c_i$ or $c_j$, such that the timing constraints of the interconnects between $c_i$ and $c_j$ can be relaxed. This process can be iterated until the results generated by the tool satisfy all the timing constraints, in addition to those on power and area.

While the present invention has been particularly described in conjunction with a specific preferred embodiment, it is evident that many alternatives, modifications and variations will be apparent to those skilled in the art in light of the present description. It is therefore intended that the appended claims will embrace any such alternatives, modifications and variations as falling within the true scope and spirit of the present invention.

Thus, having described the invention, what is claimed is:

1. A method of partitioning and floorplanning a chip represented by a netlist that includes macros to minimize power dissipated by the chip, the method comprising the steps of:
    a) generating physically implementable voltage island partitions that includes creating an internal model to capture physically implementable voltage island partitions compatibilities in terms of voltage levels between the voltage island partitions that make up the netlist;
    b) executing a chip level floorplanning of the physically implementable voltage island partitions that were generated to place compatible physically implementable voltage island partitions in close proximity of each other;
    c) placing macros within a physically implementable voltage island partition while minimizing unused space within the voltage island partitions;
    d) extending the voltage island floorplanning to include the remainder of the chip; and
    e) performing a timing analysis to validate the extended floorplan, wherein said physically implementable voltage island partitions provide the chip with a floorplan that minimizes the power dissipated, and wherein said physically implementable voltage island partitions are provided by a graph model, said graph model being a Voltage Island Compatibility Graph (VICG) based on a complete undirected graph $G(\Pi, A)$, said $\Pi$ representing voltage island vertices in VICG, and A representing arcs of said VICG.

2. The method as recited in claim 1 wherein in $G(\Pi, A)$ each vertex $\pi_i \in \Pi$ represents a voltage island and each arc $a_{i,j} \in A$ characterizes the attraction between selected islands $\pi_i$ and $\pi_j$ and each arc has a weight $w(a_{i,j})$ which is calculated by the equation:

$$w(a_{i,j}) = \begin{cases} 1 + \alpha \times wires_{i,j}, & \text{if } v(\pi_i) = v(\pi_j) \\ 0, & \text{otherwise} \end{cases}$$

where $\alpha$ is a constant, and $wires_{i,j}$ denotes the number of wires going between $\pi_i$ and $\pi_j$.

3. The method as recited in claim 2, wherein said weight guides the floorplanning by placing selected islands adjacent to each other, and determines when islands are to be merged.

4. The method as recited in claim 1 wherein in step c) said floorplanning minimizes unused space between the physically implementable voltage islands and reduces overlaps between said physically implementable voltage islands.

5. The method as recited in claim 1, further comprising the step of:
    sorting voltage levels based on how many of said physically implementable voltage islands are assigned to a corresponding voltage level, wherein the voltage levels that are used by the most voltage islands are given priority in order to maximize the probability of finding mergeable islands.

6. The method as recited in claim 5, wherein an island-level floorplanner is applied to each of the newly merged islands in order to minimize their outlines.

7. A program storage device readable by machine, tangibly embodying a program of instructions executable by the machine to perform method steps for providing a floorplan of an integrated circuit chip represented by a netlist that includes macros to minimize power dissipated by the chip, said method steps comprising:
    a) generating physically implementable voltage island partitions that includes creating an internal model to capture physically implementable voltage island partitions compatibilities in terms of voltage levels between the voltage island partitions that make up the design netlist;
    b) executing a chip level floorplanning of the physically implementable voltage island partitions that were generated to place compatible physically implementable voltage island partitions in close proximity of each other;

c) placing macros within a physically implementable voltage island partition while minimizing unused space within the voltage island partitions;

d) extending the voltage island floorplanning to the remainder of the chip design; and e) performing a timing analysis to validate the extended floorplan wherein said physically implementable voltage island partitions provide the chip with a floorplan that minimizes the power dissipated, and wherein said physically implementable voltage island partitions are provided by a graph model, said graph model being a Voltage Island Compatibility Graph (VICG) based on a complete undirected graph $G(\Pi, A)$, said $\Pi$ representing voltage island vertices in VICG, and A representing arcs of said VICG.

* * * * *